(12) United States Patent
Ettenberg et al.

(10) Patent No.: US 11,694,981 B2
(45) Date of Patent: Jul. 4, 2023

(54) DIELECTRIC MOLDED INDIUM BUMP FORMATION AND INP PLANARIZATION

(71) Applicant: Princeton Infrared Technologies, Inc., Monmouth Junction, NJ (US)

(72) Inventors: Martin H Ettenberg, Princeton, NJ (US); Michael Lange, Newtown, PA (US)

(73) Assignee: Princeton Infrared Technologies, Inc., Monmouth Junction, NJ (US)

( * ) Notice: Subject to any disclaimer, the term of this patent is extended or adjusted under 35 U.S.C. 154(b) by 315 days.

(21) Appl. No.: 16/975,633

(22) PCT Filed: May 3, 2019

(86) PCT No.: PCT/US2019/030708
§ 371 (c)(1),
(2) Date: Aug. 25, 2020

(87) PCT Pub. No.: WO2019/213601
PCT Pub. Date: Nov. 7, 2019

(65) Prior Publication Data
US 2020/0411463 A1    Dec. 31, 2020

Related U.S. Application Data

(60) Provisional application No. 62/666,528, filed on May 3, 2018.

(51) Int. Cl.
*H01L 23/00* (2006.01)
*H01L 27/146* (2006.01)

(52) U.S. Cl.
CPC .............. *H01L 24/11* (2013.01); *H01L 24/13* (2013.01); *H01L 24/14* (2013.01); *H01L 24/16* (2013.01);
(Continued)

(58) Field of Classification Search
CPC ......... H01L 24/11; H01L 24/13; H01L 24/14; H01L 24/16; H01L 24/81; H01L 27/1469; H01L 2224/10145; H01L 2224/11013; H01L 2224/1145; H01L 2224/1147; H01L 2224/11502; H01L 2224/11849; H01L 2224/11901; H01L 2224/13082; H01L 2224/13109; H01L 2224/14131; H01L 2224/16145; H01L 2224/81191; H01L 2224/81193; H01L 2224/81201; H01L 21/0272; H01L 2224/0401;
(Continued)

(56) References Cited

U.S. PATENT DOCUMENTS

2005/0194695 A1* 9/2005 Lin .................. H01L 24/48
257/E21.705
2017/0260348 A1* 9/2017 Kon ................... C08J 9/143
(Continued)

*Primary Examiner* — Douglas W Owens
(74) *Attorney, Agent, or Firm* — Fox Rothschild LLP (57) ABSTRACT

The disclosed technique may be used to electrically and physically connect semiconductor wafers. The wafer may utilize a thick dielectric. Indium bumps may be deposited and patterned in a dielectric film with a small diameter, tall height and substantially uniform in size and shape. The indium can be melted to create small grain size and uniform height bumps. The dielectric film may feature trenches around the indium bumps to prevent shorting of pixels when pressed together.

12 Claims, 7 Drawing Sheets

(52) U.S. Cl.
CPC .......... *H01L 24/81* (2013.01); *H01L 27/1469* (2013.01); *H01L 2224/10145* (2013.01); *H01L 2224/11013* (2013.01); *H01L 2224/1145* (2013.01); *H01L 2224/1147* (2013.01); *H01L 2224/11502* (2013.01); *H01L 2224/11849* (2013.01); *H01L 2224/11901* (2013.01); *H01L 2224/13082* (2013.01); *H01L 2224/13109* (2013.01); *H01L 2224/13124* (2013.01); *H01L 2224/13147* (2013.01); *H01L 2224/14131* (2013.01); *H01L 2224/16145* (2013.01); *H01L 2224/81191* (2013.01); *H01L 2224/81193* (2013.01); *H01L 2224/81201* (2013.01)

(58) Field of Classification Search
CPC ... H01L 2924/3841; H01L 2224/05567; H01L 2224/056; H01L 2224/06102; H01L 2224/11902; H01L 2224/83104
See application file for complete search history.

(56) References Cited

U.S. PATENT DOCUMENTS

| | | | |
|---|---|---|---|
| 2018/0076165 A1* | 3/2018 | Aoki | H01L 24/30 |
| 2019/0244924 A1* | 8/2019 | Zhang | H01L 24/11 |

* cited by examiner

DIELECTRIC MOLDED INDIUM BUMP FORMATION AND INP PLANARIZATION

CROSS REFERENCE TO RELATED APPLICATIONS

The present application claims the benefit of U.S. Provisional Application Ser. No. 62/666,528 filed on May 3, 2018, the contents of which is hereby incorporated by reference in its entirety.

FIELD OF THE INVENTION

The disclosed implementations relate generally to the field of semiconductor fabrication processes and specifically methods and devices for hybridization of dissimilar materials at both the chip level and the wafer level.

BACKGROUND

Advancements in semiconductor fabrication processing has enabled a vast quantity of data processing power from a small area of silicon. It is sometimes desirable for multiple processes to occur in the same area, such as converting photons to electrons and digitizing that signal. To facilitate this capability, the silicon industry has developed "through silicon via" (TSV) technology to physically fuse together multiple silicon wafers with electrical contacts between them. One successful application of this technology is to dedicate one wafer for the collection of photons while fabricating analog to digital converters for every pixel to digitize that information on the second wafer.

However, silicon cannot do everything. It is advantageous to integrate other materials, having different optical or electrical properties from silicon, with high electrical interconnect density. Using TSV technology developed for silicon is problematic with multiple materials types for two main reasons: differences in thermal expansion coefficients and the bowing or lack of flatness found in some non-Silicon based materials. Thus, a need exists for a process that can enable the integration of dissimilar materials.

SUMMARY

Fusing together two dissimilar materials with a high density of interconnects on a chip is critical to enable communication between the two structures. This high density interconnection is currently conducted at the chip level for imaging devices but conducting this at the wafer level instead of the chip level permits improved alignment and lower cost.

To eliminate the two problems (differences in thermal expansion coefficients and the bowing or lack of flatness found in some non-Silicon based materials) a new method for processing and hybridizing dissimilar materials at the chip and wafer level is disclosed. This new technique will leverage some of the TSV work and lessons learned from Silicon-based techniques and the use of indium bump technology in the infrared industry. The disclosed technique can be used to remove the bow from wafers due to manufacturing and processing to allow high density interconnects on sub fifteen (15) μm pitch and accommodate mismatched coefficients of thermal expansion by having room temperature hybridization. The two wafers may, for example, utilize copper or aluminum stud bumps in thick dielectric to remove the bow and create a planar surface. Indium bumps may be deposited and patterned in a dielectric film with a small diameter, tall height and substantially uniform in size and shape. The patterned dielectric film will feature trenches around the indium bumps to prevent lateral shorting of pixels when either the copper studs are driven into the indium bumps or when indium bumps are driven into other indium bumps during hybridization of two different materials. The indium can be placed on one or both wafers during hybridization. The small diameter of the columns combined with the tall height enables wafer scale hybridization with a very high density interconnect, high reliability, and the ability to accommodate mismatches in the coefficients of thermal expansion of the constituent materials due to the ductility of indium and the ability to hybridize at room temperature.

Deposition of Indium in deep dielectric vias made from silicon dioxide or silicon nitride or another dielectric material may be placed on top of material to be hybridized to another wafer. The dielectric film may be from 2 um to 30 um thick. Holes or vias are made in the dielectric from the top surface to the metal contact under the dielectric. The indium is deposited in the holes formed in the dielectric. The indium may then be melted in the dielectric column. This process can be repeated multiple times to fill the hole in the dielectric film. The dielectric is then removed leaving a solid uniform column of indium. The amount indium deposited combined with the amount of dielectric re-moved decides the height of the indium bumps.

Photoresist still directs where the indium is deposited but the indium shape and size is not dictated by the photoresist. The dielectric is used as a mold to form the indium bumps versus using photo-resist. This enables the application of indium in multiple runs with different photoresist applications. This would allow for taller indium columns then what could be formed by photoresist liftoff alone. This cannot be done with photoresist by itself as we would damage the indium on each new application of photoresist on top of existing indium. The indium is soft and the photoresist would knock over the columns. The dielectric protects the sidewalls of the indium column or bump.

After the photoresist is removed we can melt the indium in the vias formed in the dielectric. The Indium metal is deposited into the holes and re-flowed above its melting point to form flat, uniformly shaped Indium Bumps. Indium melts at a relatively low temperature that does not cause any thermal damage to the electronic or photonic device circuits. The indium then perfectly matches the via shape. This cannot be done with photoresist since the photoresist will burn at the melting point of indium.

The dielectric (e.g. silicon dioxide) is used to form the indium bumps. In addition to removing the dielectric to decide the height of the indium bump it allows one to form a trench around the indium bump and some of it can be left between the bumps. This removal of the dielectric between columns of indium permits space for indium compression but prevents lateral indium to indium shorting when the two materials are pressed together.

Compression can be indium to indium bumps (indium on two different chips) or it could be just indium on one side to a metal contact on the other or indium bump on one side and a metal column on the other side. The metal column and indium may or may not have the dielectric trench around it. The metal column can be driven into the indium bump instead of indium to indium compression or indium compressed directly to a metal contact point.

Implementations of the present disclosure include a method of fabricating a semiconductor device, the method steps of: depositing a dielectric film having a thickness of greater than 2 micrometers on a semiconductor wafer; opening holes through the dielectric film; depositing indium or an alloy of indium in the holes; melting the indium or alloy of indium deposited in the holes to form indium columns that are uniform in size and shape; repeating the depositing and melting of the indium or alloy of indium until the indium columns reach a desired height; removing at least a portion of the dielectric film to expose a plurality of substantially uniform indium columns on a surface of the semiconductor wafer having a pitch of less than 15 micrometers.

The method may also include the steps of: planarizing the dielectric film surface prior to opening holes through the dielectric film; forming trenches around the indium columns by removing the dielectric film immediately adjacent, surrounding, or otherwise abutting the indium columns as part of the removing step, but leaving a portion of the dielectric film between the indium columns but does not immediately touch the indium columns to form dielectric walls that prevent shorting when the indium deforms; hybridizing a first semiconductor wafer to a second planarized semiconductor wafer, wherein the second semiconductor wafer includes a dielectric layer deposited thereon in which a plurality of holes are formed and in which holes a plurality of substantially uniform metal columns are formed surrounded by trenches separating the metal columns from the dielectric layer, by pressing the metal columns of the second planarized semiconductor wafer into the indium columns of the first planarized semiconductor layer; and depositing photo resist on the dielectric film prior to depositing the indium or alloy of indium.

Further implementations include a method of fabricating a semiconductor device, the method comprising: depositing a plurality of metal contacts onto a semiconductor wafer; depositing a first dielectric film on the semiconductor wafer; planarizing a surface of the first dielectric film; opening holes through the first dielectric film; depositing a first metal in the holes to form first metal columns such that the top of the first metal columns is flush with the surface of the first dielectric film; depositing a second dielectric film having a thickness greater than 2 micrometers on the first dielectric film; opening holes in the second dielectric film above the first metal columns; depositing a second metal in the holes of the second dielectric film; melting the second metal deposited in the holes to form second metal columns that are uniform in size and shape; repeating the depositing and melting of the second metal until the second metal columns reach a desired height; and removing at least a portion of the second dielectric film to expose a plurality of substantially uniform second metal columns that are in direct electrical contact with the metal contacts on a surface of the semiconductor wafer, wherein the second metal columns have a pitch of less than 15 micrometers. The first metal may be copper and the second metal may be indium or an alloy of indium.

Further implementations include a hybridized semiconductor device constructed of semiconductor wafers fabricated using one or more of the disclosed methods. The semiconductor device includes a first semiconductor wafer having: a planarized surface; a plurality of flat, substantially uniform, and indium columns deposited on the planarized surface of the first semiconductor wafer and having a pitch of less than 15 micrometers; and a plurality of trenches surrounding the indium columns bounded by walls of a partially removed dielectric layer in which the indium columns were formed. The semiconductor device also includes a second semiconductor wafer having: a planarized surface; a plurality of flat, substantially uniform metal columns deposited on the planarized surface of the second semiconductor wafer and having a pitch that matches that of the indium columns deposited on the first semiconductor wafer; and a plurality of trenches surrounding the metal columns bounded by walls of a partially removed dielectric layer in which the metal columns were formed. The hybridized semiconductor device may be constructed by pressing the second semiconductor wafer into the first semiconductor wafer such that the metal columns are pressed into the indium columns to establish electrical contact between the first and second semiconductor wafers.

BRIEF DESCRIPTION OF THE DRAWINGS

The various aspects, features and embodiments of the disclosed semiconductor assemblies and methods of manufacturing the same will be better understood when read in conjunction with the figures provided. Embodiments are provided in the figures for the purpose of illustrating aspects, features and/or various embodiments of the semiconductor assemblies and methods of manufacturing the same, but the claims should not be limited to the precise arrangement, structures, features, aspects, embodiments or devices shown, and the arrangements, structures, subassemblies, features, aspects, embodiments, methods, and devices shown may be used singularly or in combination with other arrangements, structures, subassemblies, features, aspects, embodiments, methods and devices.

DETAILED DESCRIPTION

The following description is made for illustrating the general principles of the invention and is not meant to limit the inventive concepts claimed herein. In the following detailed description, numerous details are set forth in order to provide an understanding of the semiconductor assemblies and methods of manufacturing the same, however, it will be understood by those skilled in the art that different and numerous embodiments of the semiconductor assemblies and methods of manufacturing the same may be practiced without those specific details, and the claims and invention should not be limited to the embodiments, subassemblies, features, processes, methods, aspects, features of details specifically described and shown herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified.

Silicon wafers can be flat to within a 0.05 μm differential across a 300 mm diameter wafer. On the other hand, wafers made from InP and GaAs substrates may have significantly more bow. For example, a 150 mm diameter GaAs wafer may have a warp of ≤10 μm and total thickness variation of ≤10 μm. The specifications for InP wafers are similar and the cumulative effects of processing steps where metals and dielectrics are added can double the amount of bow and variation across the wafer. A total thickness variation (TTV) of the semiconductor surface may be a vertical measurement of the total variation, from the highest thickness value to the lowest thickness value, across the entire wafer and processed wafers can show >10 μm of variation. Another measure, the total indicator reading (TIR) of the semiconductor surface, is a sum of the absolute values of the highest and lowest thicknesses relative to a reference focal plane, for example, a fitted plane averaging the thickness variation across the surface of the wafer. TIR is also referred to as "warp". Another measure, the local thickness variation (LTV) of the semiconductor surface performs the thickness variation measurement across a localized portion of the wafer, rather than across the entire wafer (as in TTV described above). These non-uniformities pose significant challenges to accommodate the accumulated differences in height when attaching the two wafers. Adding to the difficulty in this example, InP and GaAs are both very brittle materials and putting stress on the material can cause cracking or breakage when combining with each other of Si wafers.

Differences in the coefficients of thermal expansion of dissimilar materials presents a second challenge to hybridization. Most through silicon via (TSV) techniques require heating of the material to over 200° C., some up to 300-400° C., to allow the fusing of the metals and dielectrics to each other. Even when cooling from only 200° C., mismatches in the coefficients of thermal expansion can introduce strain between the two materials. For example, silicon's linear thermal expansion is 2.6 μm/m/° C. while that of and InP is 4.75 μm/m/° C. and that of GaAs is 6.86 μm/m/° C. If a Si wafer was bonded to a GaAs wafer at 200° C. and perfectly aligned in the center, the outside edges of the two wafers would be in a different position after cooling. An unconstrained 150 mm diameter Si wafer would shrink a total of 35 μm on each edge toward center, but an unconstrained GaAs wafer of the same size will shrink by 93 μm. That difference of 58 μm introduces stress on the bonds between the two wafers, particularly around the periphery of the wafers, causing the two layers to rip apart during cool down to room temperature. If the pitch between bonds is 15 μm the movement is equivalent to almost 4 bond lengths. To mitigate this effect, a new technique that can join the two wafers at or near room temperature is needed.

Pure indium bump technology is being utilized on imagers as small as 8 μm pitch and arrays as large as 1280×1024 pixels on chips used for research and development, corresponding to a 10×8 mm chip. This is equivalent to 15,000 connections/mm$^2$. Large chips, for example, 4096×4096 (i.e. 4 k×4 k), have been hybridized on larger pitches of 10 μm in InSb and HgCdTe to Si for a larger chip of approximately 40×40 mm. There have been some specialized arrays with larger sizes but these typically utilize low yield processes since there is only a single program deliverable. In another example, 2048×2048 (i.e. 2 k×2 k) arrays may be used for specialized products, for example for military aircraft. Pixel yield on these large area devices may be approximately 99% for delivered units. However, many devices may not match this pixel yield because of hybridization issues. Hybridization is not yet available on the wafer scale because of the risk of processing failures for indium deposition across 100 mm or 150 mm diameter wafers. Further, detector materials, such as, for example, HgCdTe, are expensive. Hybridization is done on the die level matching good detectors to good readout integrated circuits (ROICs) for large area devices. Continuing to reduce the pixel pitch using current technology is difficult because the indium bump height has to account for the differences in bow across the chip or wafer, requiring the indium bumps to have increasing large aspect ratios (height to area). Patterning very thin and tall indium bumps is difficult using traditional photoresist-based techniques.

To accommodate wafer bow and flatness after processing, the disclosed implementations utilize techniques used in the TSV Si sector in concert with the newest technologies for growing thick dielectrics like silicon dioxide and nitride layers with new high rate plasma chemical vapor deposition (CVD) systems. The process includes growing dielectric layers, for example approximately 8 to 12 μm thick, and creating Cu or Al pillars in the dielectric layer to allow for electrical interconnects to the two dissimilar materials which could be Si to InP or Si to GaAs. The wafers are then polished to remove most of the bow and processing inconsistencies to create a relatively flat surface. The copper serves as an electrical interconnect with high conductivity that can be easily be polished away as needed. In most TSV applications there is concern with "cupping" in the metal surface upon polishing. "Cupping" is where the dielectric is polished flat but the metal (Cu in this case) is bowed locally. The metal appears as a cup that is not flat after polishing like the dielectric. In this case, cupping will not be an issue because there will not be a Cu pillar to Cu pillar interconnect when the wafers are hybridized. If they are cupped there is very little contact area for the two pillars when they touch. The cupping creates a void. Instead in this process the top of the Cu pillar may have indium deposited on top of it or the Cu pillar may be making contact with the In bump that is deposited on the mating wafer which more readily conforms to the shape of the cup as the wafers are pressed together. In TSV technology the two wafers are perfectly flat and the metal contacts the metal, cupping then has a void. This makes polishing cheaper and simpler in this case since cupping is not an issue.

A dielectric layer may be grown on the mating wafer, for example 8 to 12 μm thick, to provide the structural support for the tall indium bumps. This dielectric layer may have holes patterned above the metal interconnects on the wafer and indium will be deposited in the dielectric holes either on top of the electrical contacts on the wafer or top of the Cu columns described above. Normally indium may be used with large heights to accommodate bow in the wafers and other height variabilities between the two chips to be hybridized. Building tall and narrow indium bumps is difficult due to the propensity for the indium features to liftoff when removing the photoresist. It is also difficult to deposit all of the indium in the small holes by evaporation without accumulating on the walls and not completely filling the via. This makes liftoff very difficult and leaves a poor looking column of indium. The dielectric serves as a substitute mold for the photoresist, eliminating the issues associated with using thick photoresist layers and the indium sticking to the photoresist.

Indium bumps may be patterned using liftoff photolithography with evaporative deposition techniques. This limits the deposition to about 60-80% of the thickness of the photoresist and there is only one opportunity to deposit the indium (for example, taller indium bumps cannot be formed by successive liftoff photolithography and evaporative deposition steps). The current methodology utilizes a very large evaporator to deposit the indium inside deep holes patterned in the photoresist layer. The long throw of the evaporator reduces the shadowing from the thick photoresist to maximize the height of the bumps in the photoresist and to deposit the material at the bottom of the hole in the photoresist. The deposition plate is kept cool to minimize the burning of the photoresist and control the grain size of the deposited indium.

Patterning indium bumps with the current photoresist methodology has two shortcomings. First, the photoresist has a tendency to burn due to the "hot" evaporative indium deposition methods. This causes incomplete liftoff as well as sticking of the indium to the photoresist. Second, it is difficult to make thick photoresist with straight sidewalls with patterned features that are narrow and tall, as would be required for a 6 μm tall indium bump that is only 3 μm wide.

Figure 1:
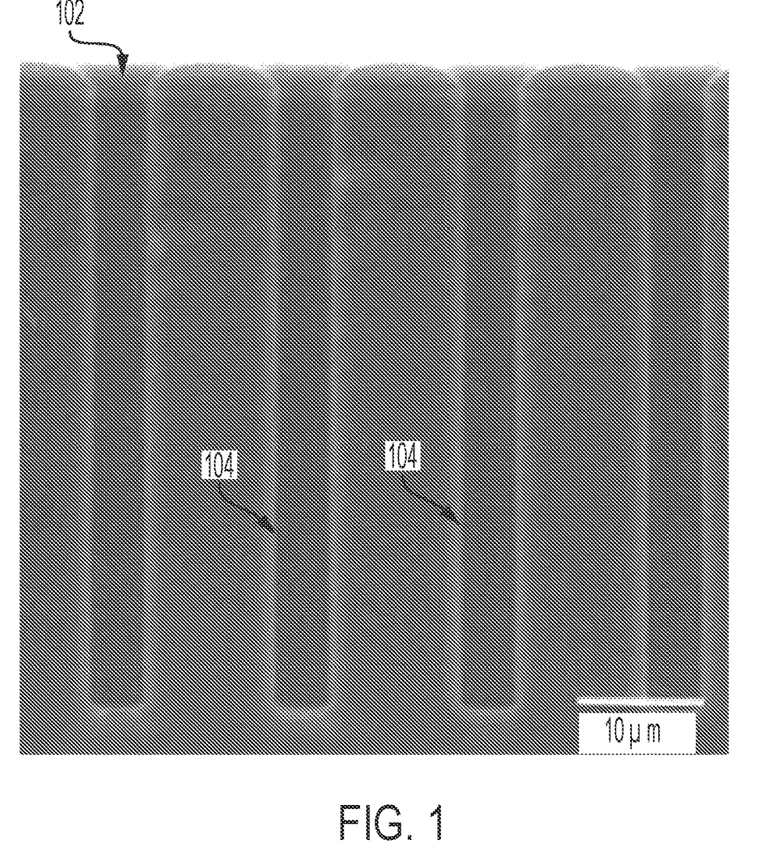
FIG. 1 is a scanning electron microscope image of thick silicon dioxide layer (a dielectric) etched with deep via columns.
Figure 2:
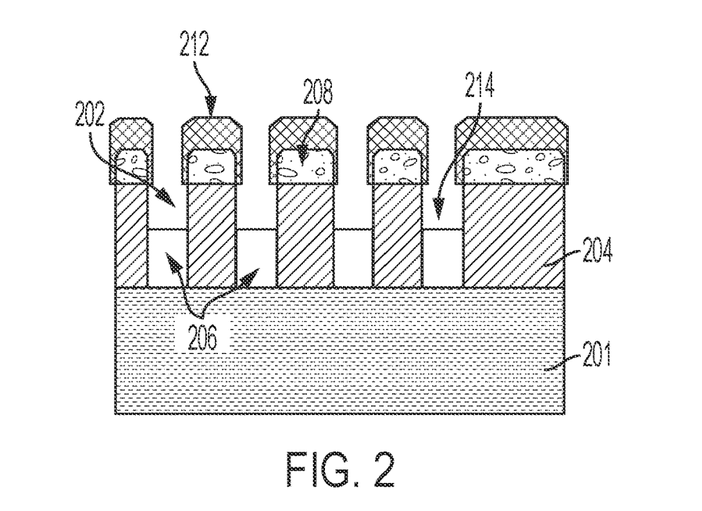
FIG. 2 is a diagram of a semiconductor wafer with dielectric vias for deposition of the indium.

On the other hand, and referring to FIG. 1, very thick dielectric layers can be patterned with narrow features 102 with very straight sidewalls 104, as shown in microscope image in FIG. 1. A thinner layer of photoresist can then be used over multiple indium deposition steps to fill the dielectric holes or trenches with indium, as shown in FIG. 2 and described in more detail below. Thinner photoresist is easier to control and liftoff without sticking. Additionally, multiple indium deposition steps cannot be performed with photoresist alone because the already patterned indium is readily damaged when spinning on new photoresist layers.

The disclosed method deposits taller indium bumps on smaller pitch. Referring now to FIG. 2, a thick dielectric layer 204 is deposited on a semiconductor wafer 201 described above and is patterned with deep holes 202 on a relatively small pitch. A layer of photoresist 208 is deposited Indium 206 is then deposited in the holes 202 using photoresist 208 layers since the photoresist 208 is not required to provide the sidewalls for the indium bumps 206, as shown in FIG. 2. Once the photoresist 208 is removed, the only indium 206 remaining is inside the dielectric holes 202. Unlike the traditional indium bump deposition process, the photoresist 208 can be applied many times as the previously deposited indium inside the holes 202 is protected from the new photoresist patterning. The new photoresist layer 208 is then used as a fresh mask for the deposition of additional indium 206 into the dielectric hole 202. The indium can be melted after each deposition cycle to settle it to the bottom of the dielectric column. Indium melts at approximately 160° C., depending on purity, at this temperature the dielectric will not be damaged by the molten indium. An added benefit is that this process makes the throw of the evaporator less important as potential shadowing is overcome during melting by allowing the indium to flow to the bottom of the hole in preparation for the next indium deposition cycle. In shadowing some of the indium sticks to the sidewall instead of going to the bottom of the hole 202. This causes incomplete columns to form. By melting all the indium flows to the bottom of the hole 202 to form columns 214. By using multiple photolithography steps and indium deposition runs, the dielectric holes can be filled with indium in a precisely controlled manner to achieve the desired column height on a tight pitch.

Once the indium is placed in the hole, the next processing step is the removal of the dielectric. The thickness of the removed dielectric will determine the height of the indium bumps. Since the indium is molded by the shape of the dielectric holes, straight and tall indium columns are revealed upon the removal of the dielectric. The dielectric is removed by plasma etching that has little chance of disfiguring the indium columns. Thus, the dielectric can be removed leaving behind the indium columns with little to no damage. Plasma etching is a cleaner method than photoresist liftoff which can also be used but may include risks of incomplete liftoff or sticking and removing the indium columns.

Figure 3A:
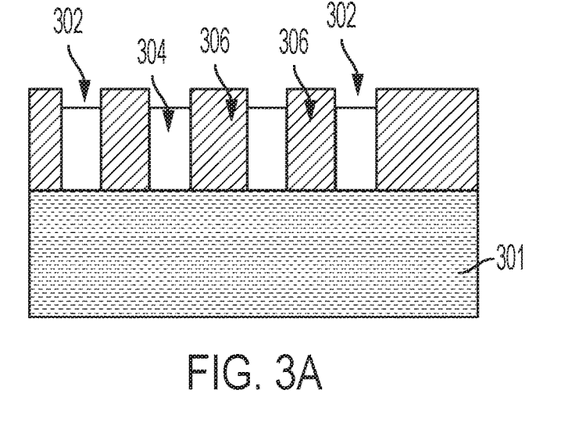
FIG. 3a is a diagram of a semiconductor wafer with Indium deposited in the vias.
Figure 3B:
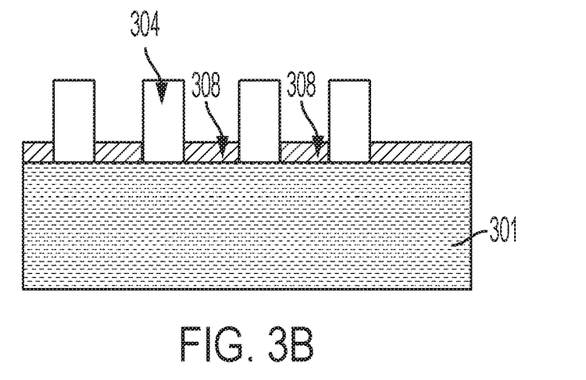
FIG. 3b is a diagram of a semiconductor wafer showing well-formed small pitch tall indium bumps following removal of the dielectric.

Referring to FIG. 3a, after filling the dielectric trench 302 with indium 304, the indium 304 can be melted within its dielectric trench 302. This improves the uniformity of the array of indium columns 304 (see FIG. 3b) as it allows them to melt to the same height and shape and solidify back to a similar crystallinity. Even if the indium sticks to the side walls and forms voids during the deposition process these can be repaired across the wafer 301 through melting. This process is not possible with photoresist in place instead of dielectric 306 because the photoresist will burn at the melting point of indium nor can it be done after the photoresist is removed because, without the trench walls 306 the surface tension will turn the indium into round balls that are wider and shorter. Hybridizing arrays of round bumps against each other leads to poor presses because the round objects tend to slip off one another. The advantage of the dielectric trenches 302 is that it physically constrains the molten indium 304 to the inside of the cavity and will not burn at elevated temperatures. The surface tension may introduce a slightly rounded shape on the top surface, but the rest of the column should be very straight and uniform. Referring to FIG. 3b, plasma etching may be used to remove at least a portion of the etched dielectric walls 308 to reveal indium columns 304. The indium accommodates for the cupping in the copper column when the wafers are pressed together. The disclosed process for the patterning of the high aspect ratio indium bumps using the removal of dielectric is expected to have much higher yield, better shape control, and improved array uniformity compared to techniques using liftoff photoresist.

Figure 4:
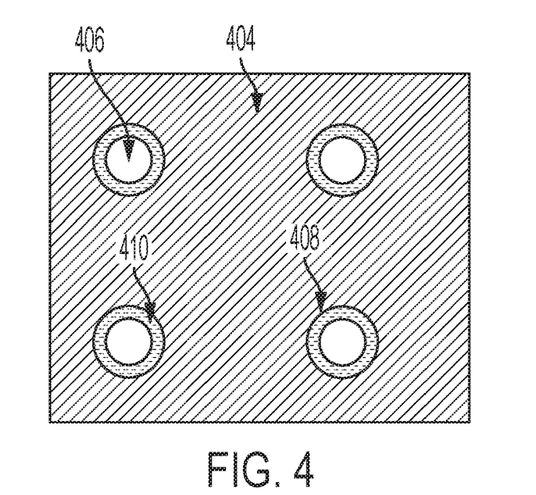
FIG. 4 is a diagram of a semiconductor wafer that shows a top view of indium columns with trenches etched around each column of indium.

The dielectric removal process can also be altered to design in dielectric structures that further assist the hybridization step. In an example shown in FIG. 4, in lieu of removing all of the dielectric layer 404, photolithography coupled with plasma etching can be used to remove the dielectric material to create a space 410 between indium column 406 and dielectric walls 404 while leaving behind a network of dielectric walls 408 to isolate the columns from each other. The dielectric walls 408 serve as barriers to prevent the flow of indium, for example, barriers 602 in FIG. 6b described in more detail below, from coming into contact with neighboring columns when the indium is compressed by the copper posts or indium columns from material 1 into material 2 during hybridization. The presence of dielectric walls 408 on both wafer surfaces to be pressed together can also serve to minimize the risk of applying too much force during hybridization.

Figure 5A:
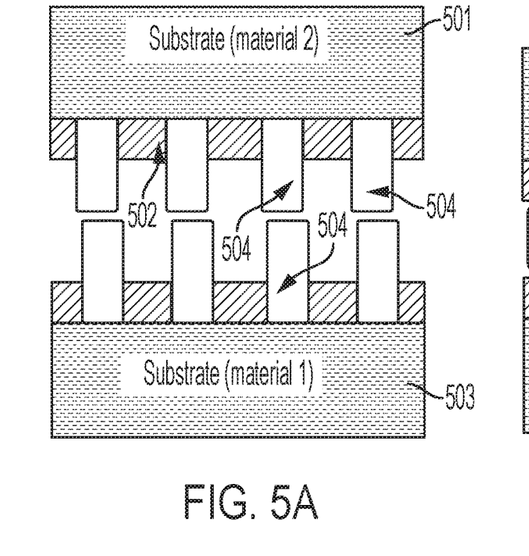
FIG. 5a is a diagram of a semiconductor wafer showing Indium bumps being pressed together after the dielectric is removed.
Figure 5B:
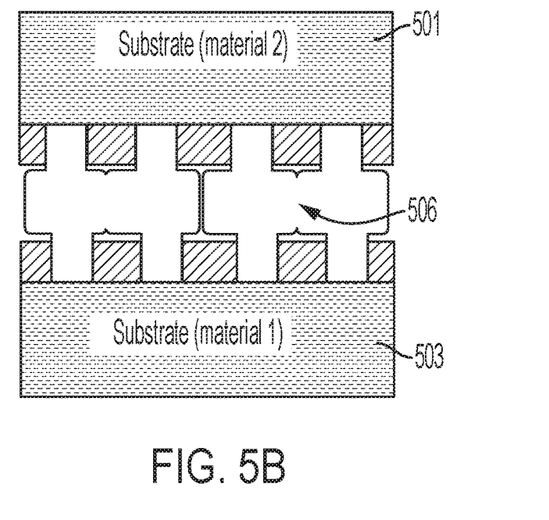
FIG. 5b is a diagram of a semiconductor wafer showing neighboring Indium bumps shorting tougher due to over-pressing.
Figure 6A:
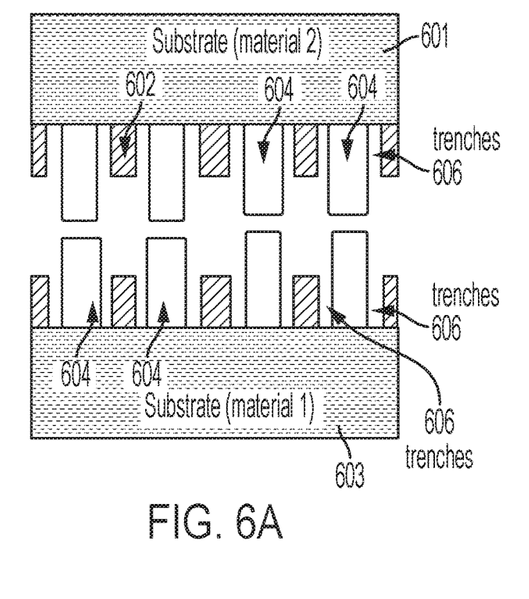
FIG. 6a is a diagram of a semiconductor wafer showing two-sided indium bumps for hybridization with dielectric barriers to prevent lateral shorting.
Figure 6B:
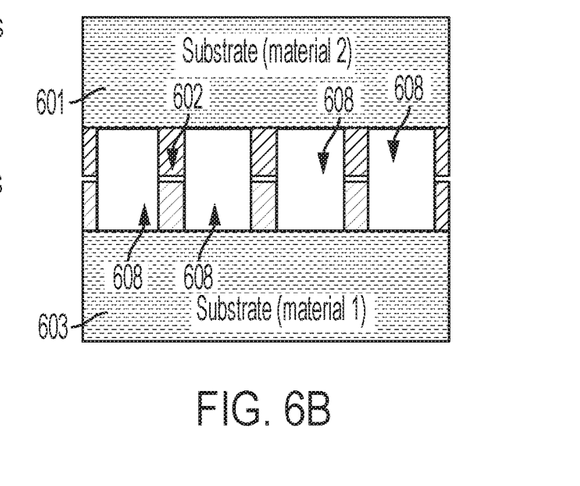
FIG. 6b is a diagram of a semiconductor wafer showing the application of trenches to prevent shorting of indium bumps.
Figure 7:
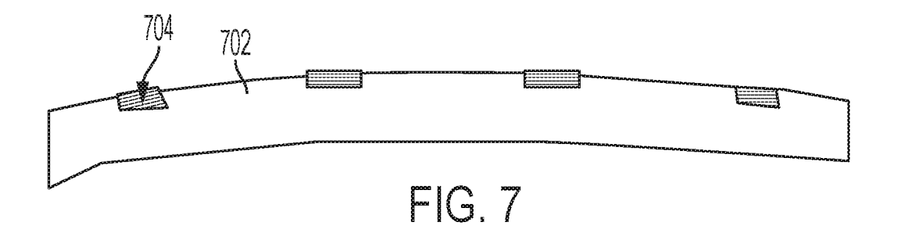
FIG. 7 is a diagram of a semiconductor wafer processed into devices with metal interconnects exhibiting bowing.

To further improve the yield when pressing a relatively flat wafer with copper or indium columns to a relatively flat wafer with indium columns, interlocking features can be added to the wafers to better secure the two wafers. Referring to FIGS. 5a-b, the most common problem with indium bumps is pixel shorting which caused by pressing the wafers together with too much force leading to indium 504 pushing outwards and making contact 506 with nearby bumps. This typically happens with indium to indium pressing at too high a force or when the wafers are not very flat and one spatial region is pressed harder than the other. Another option is indium on both sides, as shown in FIGS. 6a and 6b. Indium columns 604 are squeezed together when the material 1 is combine with material 2 forming column 608. The indium on both sides is compressed together to form one column 608 and squeezed out into the trenches 606 and the dielectric barriers 602 prevent the new columns 608 from shorting together. The use of thick dielectric layers facilitates the development of this interlocking system that prevents excess indium from squeezing out and contacting neighboring bumps.

Referring to FIGS. 6a and 6b, trenches are applied to the example shown in FIG. 5a-b. This example shows dielectric walls 602 where trenches 606 have formed around the indium bumps 604 through plasma etching processes, for example. When the two sides of indium bumps 604 are driven together for hybridization, the dielectric walls 602 form a barrier preventing the shorting of the resulting indium connections 608 as opposed to 506 in FIG. 5b.

FIGS. 7-12 show an example process for making indium columns according to the present disclosure. In an example, InP wafers 702 may be used as the dissimilar material from Si for wafer scale hybridization. Other semiconductors may be used. In an example, 100 mm diameter InP wafers have up to 10 µm of height differential between the lowest and highest points, for example, in the range of 3-10 µm. The amount of bow may be measured at the start to determine how the deposition of the metal vias 708 and thick dielectric 706 affects the bow. One can measure this height difference by looking at the metal contacts 704 on the wafer 702. This measurement may also be useful for the determination of how much dielectric must be deposited in advance of planarization by chemical-mechanical polishing (CMP).

Figure 9:
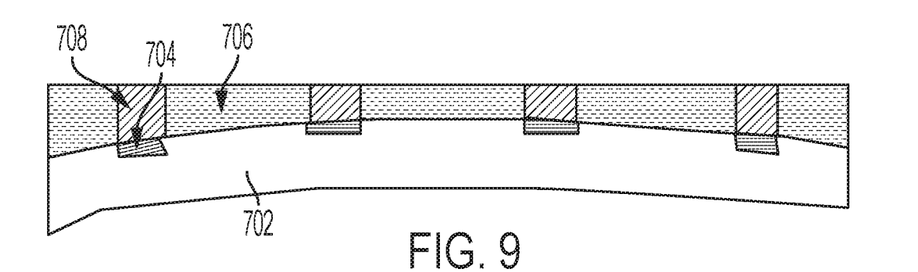
FIG. 9 is a diagram of a semiconductor wafer with open holes through dielectric layer to expose semiconductor device contacts.
Figure 10:
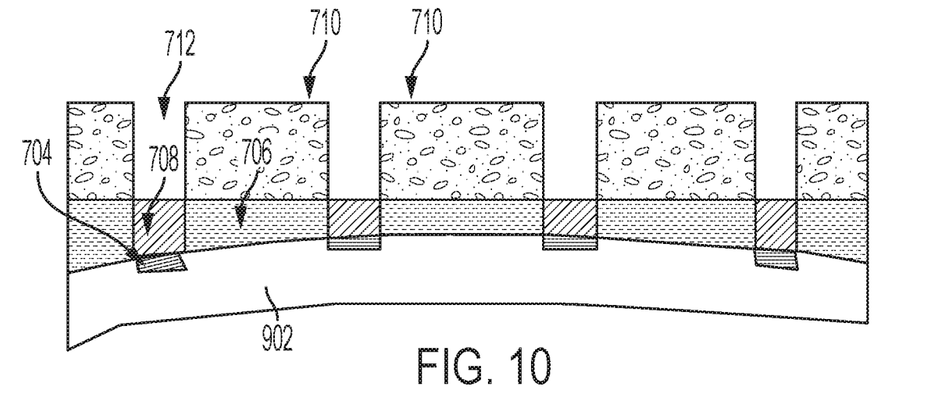
FIG. 10 is a diagram of a semiconductor wafer on which a second dielectric film is deposited across the wafer surface.
Figure 11:
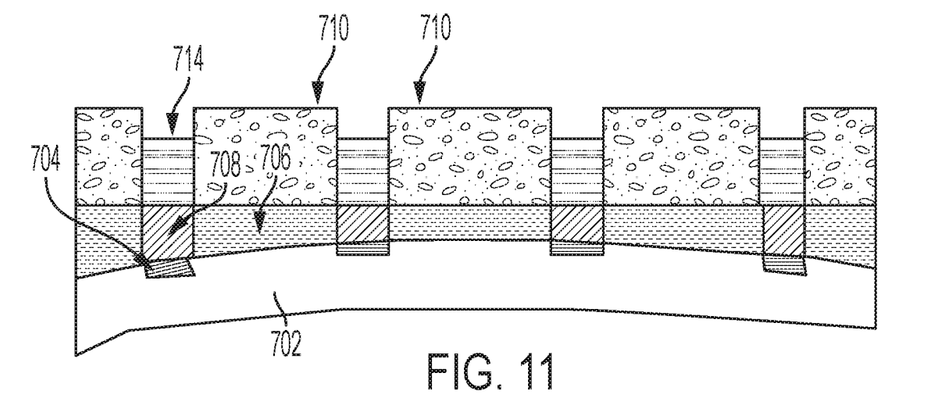
FIG. 11 is a diagram of a semiconductor wafer where the open holes are filled with indium.

Referring to FIGS. 9, 10, and 11 the metal pillars 708 in the first dielectric 706 can be processed with CMP to generate a flat surface and then indium bumps as described above can be deposited 714 on top of the new flat surface in a new dielectric 710. This enables the indium column to be electrically attached to the material 702 through its metal contact 704 via a metal column 708 on a flat surface while making all the indium the same height allowing for a simpler press to the secondary material.

Figure 8:
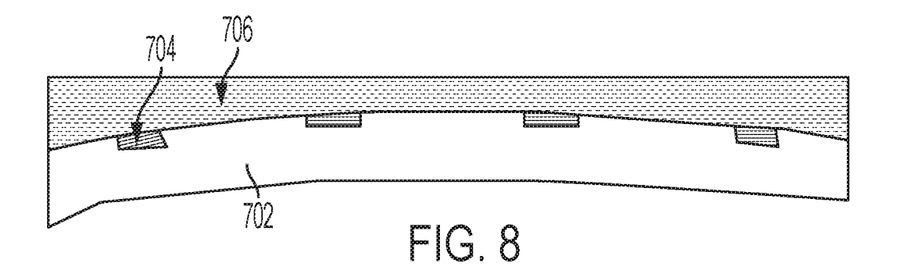
FIG. 8 is a diagram of a semiconductor wafer on which a dielectric film is deposited and the surface planarized.

After the amount of bow is determined, the thick dielectric layer 706 may be deposited on the wafers 702, as shown in FIG. 8. Before the wafers 702 are coated with dielectric 706, a seed layer is deposited to enable the copper columns 708 to take hold in the vias to the metal contact 704 during deposition, as shown in FIG. 9. In an example, 10 to 15 µm thick silicon dioxide films (a dielectric) may be deposited on, for example, InP and Si wafers. Following dielectric deposition, an initial CMP step will be performed to planarize the dielectric 706 surface and mitigate the wafer bow. Following the CMP work, the vias may be patterned to approximately 5×5 µm or smaller in the dielectric layer 706 on a 12.5 µm pitch, for example. The 12.5 µm pitch may be selected, for example, to match the pitch of an available linear array ROICs. Smaller via holes would be utilized for smaller pitch arrays for example a 2×2 µm for a 6.25 µm pitch. Multiple via types may be utilized, including ones with straight sidewalls, tapered sidewalls, and variable undercut profiles, for example. Hardmasks with chrome, for example, may be used instead of photoresist masks since the top surface will be polished.

Referring again to FIG. 9, following the formation of the via holes in the dielectric 706, conductive metal like copper 708 may be deposited into the holes. The goal is to fill the entire via with copper. The hole may be seeded to facilitate the deposition of the copper. In addition to filling the via, the copper will likely deposit elsewhere on the wafer. This extra metal will be removed by CMP.

The metals 708 deposited may be then removed from the surface of the wafers using CMP. The CMP removes the excess metal deposited for filling in the holes as well as the hard mask used to pattern the vias. This process also makes the wafers as flat as possible. A challenge when patterning metals in vias with CMP polishing is the formation of raised edges, a phenomenon known as cupping. For this process, cupping is not anticipated to be an issue because the copper pillars will be driven into indium columns which can absorb the nanometer-scale differences in height or indium will be deposited on the Cu columns removing the small difference in height of the cup. Cupping is an issue in wafer to wafer bonding. In wafer bonding, the copper columns directly contact one another. If the metal is cupped in that the bonding process then the contact area is minimized and voids will be created.

Following CMP, the flatness of the wafers may be remeasured. The goal is for the largest difference in height across the wafer to be less than the final height of the indium bumps 714 that will be formed, in this case <10 µm (two sets of 5 µm tall indium bumps if we put them on both materials). Preferably, the difference would be less than 5 µm corresponding to a single set of indium bumps 714 but this may vary depending on the amount of flatness that can be obtained and the height of indium bumps that can be manufactured.

Referring now to FIG. 10, a second dielectric layer 710 (which may have the same composition and properties as the first) may be then deposited on top of the metal pillars 708 and first dielectric 706 using, for example, thick film deposition equipment. The indium bumps and thus the second dielectric layer may also be applied directly to the wafer itself if it is determined that the wafer is flat enough to start, for example processed Si. In an example, 6 to 10 µm of silicon dioxide 710 will be deposited on the wafers. The dielectric vias 712 may be patterned in the wafers on any pitch. Multiple via types may be utilized, including ones with straight sidewalls, tapered sidewalls, and variable undercut profiles.

Referring now to FIG. 11, after the dielectric vias 712 are opened (FIG. 10), the indium 714 may be deposited into the dielectric vias 712. To deposit the indium photoresist may be used to mask and protect the dielectric surface 710 between the dielectric vias 712. After the indium 714 is deposited, photoresist liftoff may be used to remove indium everywhere except the inside of the vias 712. Because the majority of indium is inside the vias 712, this implementation of liftoff may have higher yield than traditional indium bump deposition using liftoff photolithography on a flat substrate. Sequential deposition and patterning of indium 714 may be done to fabricate taller indium bumps 714, although this process may not be accomplished with standard indium bump deposition techniques. This technique may allow the use of thinner photoresist layers leading to improved pattern resolution.

This technique of depositing the indium 714 in dielectric vias 712 provides another processing capability for the formation of uniform tall indium columns. The dielectric vias 712 serve as a mold in which the indium 714 can be melted in an oxygen-free environment and possibly under vacuum. Typically indium 714 is deposited on top of patterned photoresist. If heat is applied to melt indium in patterned photoresist, the photoresist burns making liftoff very difficult. If the indium is melted without the presence of a patterned mold, it spreads out into a ball due to surface tension. With appropriate temperature profiles, it is possible to melt the indium 714 and perform successive cycles of indium deposition and melting in the dielectric via 712. Each heating cycle will melt the newly deposited indium 714 into the preexisting indium in the dielectric via 712. The goal is to fill most of the entire dielectric via 712 with indium 714.

Figure 12:
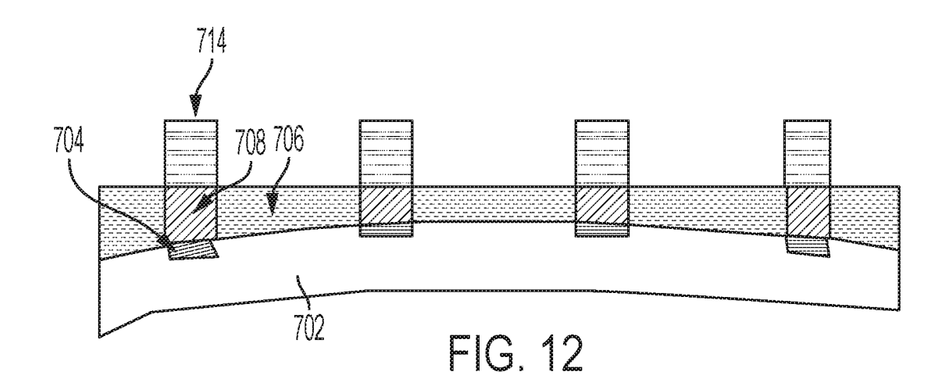
FIG. 12 is a diagram of a semiconductor wafer where the dielectric film has been removed, exposing the indium bumps.

Referring now to FIG. 12, dielectric 710 may be removed from around each indium column 714 to reveal a freestanding structure with a high aspect ratio and very straight sidewalls. Removal of the thick dielectric 710 on wafers without photomasks may be accomplished with an oxygen plasma without affecting the indium 714. Using patterned photoresist, removal of a narrow region of dielectric in contact with the column may be accomplished while leaving a grid of thin dielectric walls between the columns, e.g. columns 602 in FIG. 6a. This grid of dielectric walls may serve as barriers to electrically isolate the contacts from each other during hybridization when the Cu pillars or a set of indium bumps are pressed into the indium columns formed on the other material causing the indium to spread out laterally.

Figure 13A:
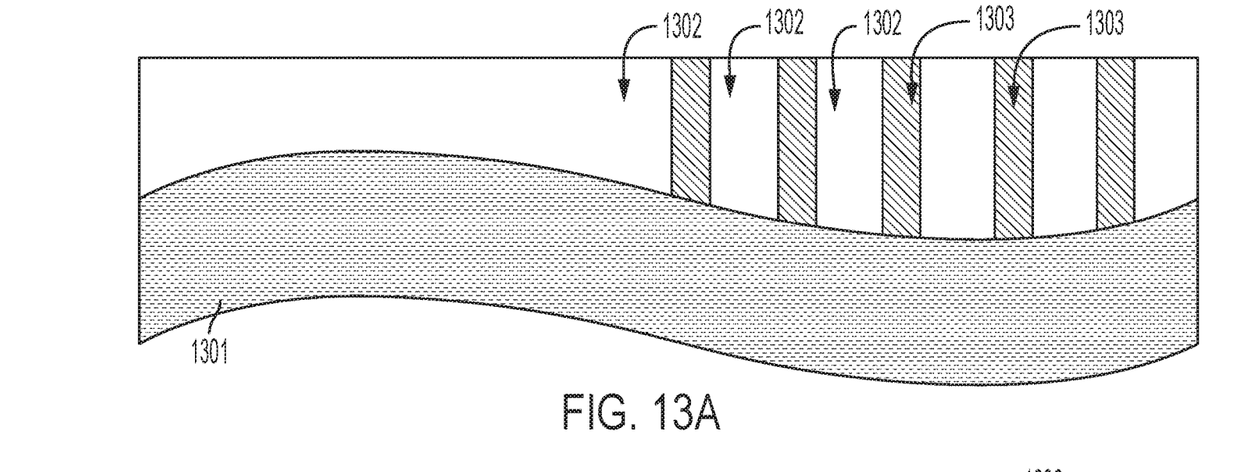
FIG. 13A is a diagram that shows depositing Cu pillars in a thick dielectric film.
Figure 13B:
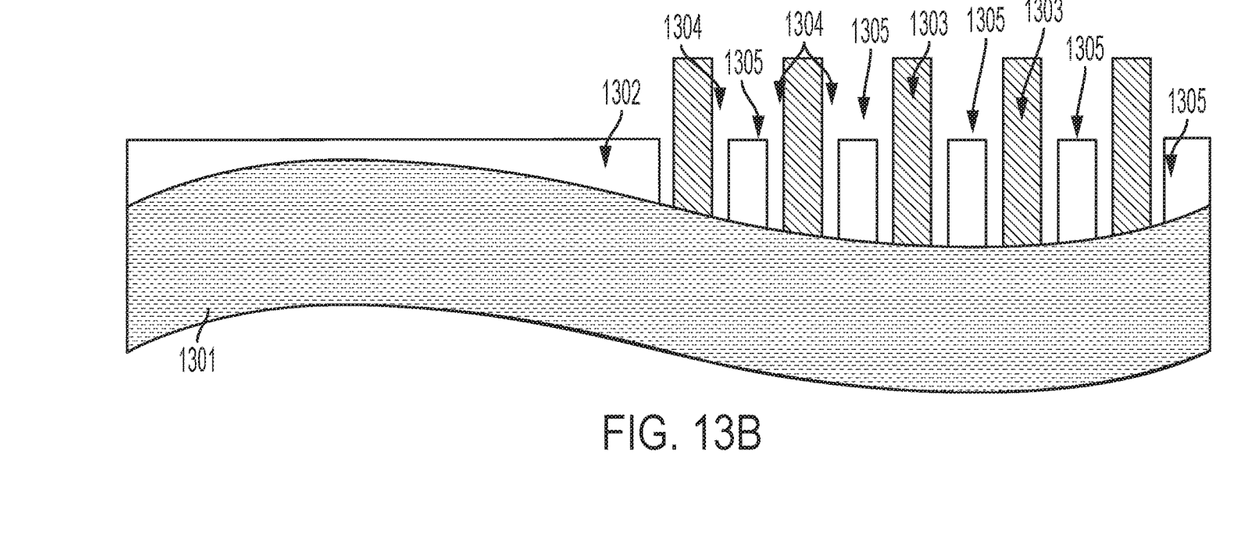
FIG. 13B is a diagram that shows trenches in the dielectric to prevent lateral indium shorting during hybridization.

Not only can a thick dielectric layer be used as a mold to form tall indium columns, but it can also be used to flatten bowed wafers. Referring now to FIGS. 13a-b, the bow of substrate 1301 can be removed by depositing a thick dielectric layer 1302 and then using CMP on the surface to remove various inconstancies. Interconnects from the base material 1301 (such as the ROIC or detector array) through the thick dielectric layer to the newly flattened surface are required prior to hybridization to the other wafer. Metals such as Cu and Al, for example, copper columns 1303, have high conductivity and are mechanically strong facilitating the process of driving these contacts into the mating indium column during hybridization to form a good electrical connection.

After deposition and planarization of the dielectric layer 1302, the next step is to create holes in the dielectric layer with relatively straight sidewalls on small pitch. The holes may, for example, measure 2 µm×2 µm wide with a depth of 10 µm through the dielectric layer. To make contact to the surface of the wafer through the thick dielectric, the hole may be filled with the conductive metal 1303, for example. In another example, 5 µm×5 µm holes on 12.5 µm pitch may be used. Due to the thickness of the dielectric layer 1302, hard mask of chrome or another metal may be used in lieu of a photoresist mask to pattern the holes to accommodate a prolonged etch time. A metal mask is much more resistant to damage from the extended period of plasma etching compared to photoresist. After etching, the sidewalls of the holes may be sloped inward, but this is not likely to be an issue as long as contact to the substrate surface is preserved.

After the holes are created in the dielectric layer 1302, the metal 1303 (copper or aluminum) may be deposited in the holes. For the interconnect to the mating wafer to be made, it is preferable for the metal 1303 to be deposited in the full height of the column without voids. In an example, metal-organic chemical vapor deposition (MOCVD) may be utilized to deposit the copper 1303 approximately 10 µm thick with substantial uniformity across the full width of the wafer 1301. The sloped sidewall of the hole may actually prove beneficial for facilitating the deposition of the copper 1303 inside the holes.

Referring now to FIG. 13a, after deposition of the metal 1303 across the entire wafer 1301, the surface is polished using CMP to clean and flatten the surface. The chrome hard mask and the metal 1303 deposited (for example copper) outside of the holes on the dielectric layer 1302 is removed by CMP which effectively planarizes the side of the wafer that will be hybridized to the second material surface. The goal is to reduce the height non-uniformity across the wafer to less than 4 µm. Any remaining differences in height less than 4 µm of height difference can be compensated by the height of indium bumps on a matching wafer to be hybridized. The biggest challenge for CMP is the handling of the InP-based wafers since they cleave and break very easily.

Referring to FIG. 13b, after the CMP process is completed, the remaining dielectric layer 1302 can be patterned and removed in the same manner used for the silicon wafer with the indium columns as above or indium columns can be placed on top of the Cu columns to allow for indium to indium bumping now that two wafers are relatively flat. Using this process one can also form trenches 1304 around the Cu columns 1303. This can be done, for example, by patterning photoresist and only etching part of the dielectric layer and leaving parts of it that form walls. The space between the walls and the indium column becomes the trenches which allow for excess indium to spread without risk of shorting. This may produce a matching set of dielectric walls 1305 to capture the indium that is pressed out during hybridization and limit the shorting of bumps as well as the amount of pressing force that is applied. An example finished InP substrate with patterned copper pillars inside a planarized dielectric surface is depicted in FIG. 13b and an example finished hybridized device is depicted in FIG. 14b. Photolithography Mask sets may be designed for patterning the vias in the dielectric layers and the patterned deposition of indium and copper or other pillar metal.

Figure 14A:
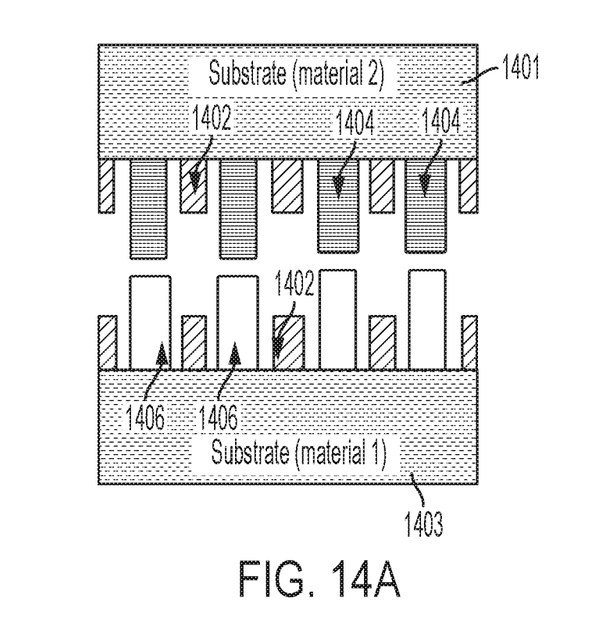
FIG. 14A is a diagram that shows trenches and/or moats around each indium bump or Cu column with the dielectric acting as the walls of the moat between each contact point.
Figure 14B:
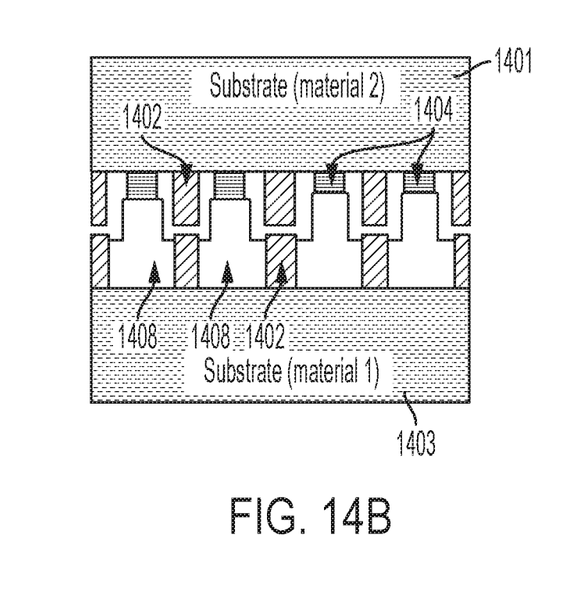
FIG. 14B is a diagram that shows trenches providing space for collecting excess indium.

FIGS. 14a-b depicts an improved strategy using moats around each Cu column 1404 in the dielectric 1402 as well as the dielectric 1402 around each indium column 1406. The Cu columns 1404 can be driven into the indium columns 1406 to make a better bond since the more ductile indium 1406 will deform and the Cu 1404 will not. The indium 1408 surrounds the Cu and excess is squeezed in to the boundary of the dielectric moats or trenches.

The hybridization of two wafers may require specialized equipment. The process will require the two wafers to be substantially aligned to one another to an accuracy, for example, better than 3 μm depending on the pitch and size of the indium bumps with the ability to compensate for the pitch and roll of each wafer. Sufficient and uniform pressure across the entire area of the wafer is desired to compress together the tens of millions of indium-copper junctions. Established Si TSV processes and indium hybridization processes on single chips may be used in addition to this technique.

Using these new features, the two wafers can now be bonded together at the chip or wafer scale at room temperature with higher yield. New machines can press 300 mm diameter and larger wafers with forces exceeding 4000 N (~400 kg) of force and placement accuracies of 0.5 μm or better.

After pressing, low viscosity, nonconductive "wicking epoxy" may be applied between the two wafers to increase the strength of the bond between the two material systems. The epoxy fills in between the forest of indium bumps to provide extra strength between the two bonded systems.

Indium has been shown to accommodate thermal stresses on large area arrays in infrared imagers. Once the imagers are hybridized, further post processing steps can be performed on the wafer level. This could include substrate removal or the application of filter arrays. Instead of applying filter arrays to individual chips, they can be applied, in the example above, to all chips at once, further reducing fabrication costs. Once the post processing is completed, the wafers can be diced. At this point the individual chips can be thermally cycled with significantly less strain as the individual chips are much smaller than the entire wafer and the magnitude of potential thermal expansion stresses is reduced. This same technique can also be used to attach lasers and detectors to processing chips to allow optical input and outputs.

In an example implementation, 100 mm diameters wafers of two dissimilar materials are hybridized, Si and InGaAs epitaxially grown on InP, on small 6.25 μm pitch. The disclosed hybridization process may be completed using existing 2048×1 linear array ROIC (currently limited to 1024×1 linear arrays on 12.5 μm pixel pitch with current Indium technology) to provide a commercially-relevant implementation without the cost of developing a new expensive ROIC. The example implementation may include:

Optimization of dielectric and Cu column deposition to reduce the bow across the surface of 100 mm diameter wafers to ≤2 μm.

Deposition of indium in dielectric columns on <7 μm pitch with heights of ≥6 on top of Cu columns.

Hybridization of 100 mm diameter wafers of Si containing the ROIC die to InP patterned with InGaAs detector arrays by fusing the In and Cu or In to In columns together. This technique can be applied to any mixed material hybrid systems including but not limited to InGaAs to Si, GaAs to Si, and GaAs to InGaAs.

Demonstration of ≥99.999% yield for 100 mm diameter wafer to wafer hybridization of dissimilar materials on sub 10 μm pitch, in this case 6.25 μm.

The use of thick dielectric layers is a well-established technology that is used in many silicon processes from microelectromechanical systems (MEMS) to integrated circuits. Their use is not common in other materials systems such as III-V semiconductors. More typically, thin film deposition is used with layers less than 1 μm thick. For the disclosed hybridization approach, dielectric films may be deposited with thicknesses exceeding 8 μm using plasma CVD type systems. These systems have been used to deposit layers as thick as 30 μm at ambient temperatures at rates approaching 500 nm/min with excellent thickness uniformity of less than ±2% variation across five different 75 mm wafers at one time.

While the foregoing is directed to various embodiments, other and further embodiments of the invention may be devised without departing from the basic scope thereof, and the scope thereof is determined by the claims that follow.

The invention claimed is:

1. A method of fabricating a semiconductor device, the method comprising:
   depositing a dielectric film having a thickness of greater than 2 micrometers on a semiconductor wafer;
   opening holes through the dielectric film;
   depositing indium or an alloy of indium in the holes;
   melting the indium or alloy of indium deposited in the holes to form indium columns that are uniform in size and shape;
   repeating the depositing and melting of the indium or alloy of indium until the indium columns reach a desired height; and
   removing at least a portion of the dielectric film to expose a plurality of substantially uniform indium columns on a surface of the semiconductor wafer having a pitch of less than 15 micrometers.

2. The method according to claim 1, further comprising planarizing the dielectric film surface prior to opening holes through the dielectric film.

3. The method according to claim 2, further comprising forming trenches around the indium columns by removing the dielectric film immediately adjacent the indium columns as part of the removing step.

4. The method according to claim 3, wherein the semiconductor wafer is a first planarized semiconductor wafer, the method further comprising hybridizing the first semiconductor wafer to a second planarized semiconductor wafer, wherein the second semiconductor wafer includes a dielectric layer deposited thereon in which a plurality of holes are formed and in which holes a plurality of substantially uniform metal columns are formed surrounded by trenches separating the metal columns from the dielectric layer, by pressing the metal columns of the second planarized semiconductor wafer into the indium columns of the first planarized semiconductor layer.

5. The method according to claim 4, wherein the metal columns of the second planarized semiconductor wafer are composed of copper.

6. The method according to claim 4, wherein the metal columns of the second planarized semiconductor wafer are composed of aluminum.

7. The method according to claim 4, wherein the metal columns of the second planarized semiconductor wafer are composed of indium or an alloy of indium.

8. The method according to claim 1, further comprising depositing photo resist on the dielectric film prior to depositing the indium or alloy of indium.

9. The method according to claim 1, wherein the semiconductor wafer is a first semiconductor wafer, the method further comprising hybridizing the first semiconductor wafer to a second semiconductor wafer, wherein the second semiconductor wafer includes a dielectric layer deposited thereon in which a plurality of metal contacts, by pressing the indium columns of the first planarized semiconductor wafer into the metal contacts of the second planarized semiconductor layer.

10. A method of fabricating a semiconductor device, the method comprising:
    depositing a plurality of metal contacts onto a semiconductor wafer;
    depositing a first dielectric film on the semiconductor wafer;
    planarizing a surface of the first dielectric film;
    opening holes through the first dielectric film;
    depositing a first metal in the holes to form first metal columns such that the top of the first metal columns is flush with the surface of the first dielectric film;
    depositing a second dielectric film having a thickness greater than 2 micrometers on the first dielectric film;
    opening holes in the second dielectric film above the first metal columns
    depositing a second metal in the holes of the second dielectric film;
    melting the second metal deposited in the holes to form second metal columns that are uniform in size and shape;
    repeating the depositing and melting of the second metal until the second metal columns reach a desired height; and
    removing at least a portion of the second dielectric film to expose a plurality of substantially uniform second metal columns that are in direct electrical contact with the metal contacts on a surface of the semiconductor wafer, wherein the second metal columns have a pitch of less than 15 micrometers.

11. The method according to claim 10 wherein the first metal is copper or aluminum and the second metal is indium or an alloy of indium.

12. A hybridized semiconductor device comprising:
    a first semiconductor wafer comprising:
        a planarized surface;
        a plurality of flat, substantially uniform indium columns deposited on the planarized surface of the first semiconductor wafer and having a pitch of less than 15 micrometers; and
        a plurality of trenches surrounding the indium columns bounded by walls of a partially removed dielectric layer in which the indium columns were formed; and
    a second semiconductor wafer comprising:
        a planarized surface;
        a plurality of flat, substantially uniform metal columns deposited on the planarized surface of the second semiconductor wafer and having a pitch that matches that of the indium columns deposited on the first semiconductor wafer; and
        a plurality of trenches surrounding the metal columns bounded by walls of a partially removed dielectric layer in which the metal columns were formed;
    wherein the hybridized semiconductor device is constructed by pressing the second semiconductor wafer into the first semiconductor wafer such that the metal columns are pressed into the indium columns to establish electrical contact between the first and second semiconductor wafers.

* * * * *